United States Patent [19]
Staats

[11] Patent Number: 5,619,717
[45] Date of Patent: Apr. 8, 1997

[54] VECTOR QUANTIZATION USING THRESHOLDS

[75] Inventor: Erik Staats, Felton, Calif.

[73] Assignee: Apple Computer, Inc., Cupertino, Calif.

[21] Appl. No.: 483,282

[22] Filed: Jun. 7, 1995

Related U.S. Application Data

[63] Continuation of Ser. No. 82,022, Jun. 23, 1993, Pat. No. 5,481,739.

[51] Int. Cl.$^6$ .................................................. G06F 7/60
[52] U.S. Cl. .................. 395/800; 364/259.9; 364/260.6; 364/259; 364/DIG. 1
[58] Field of Search .............................. 395/800; 348/405

[56] References Cited

U.S. PATENT DOCUMENTS

| | | | |
|---|---|---|---|
| 4,878,230 | 10/1989 | Murakami et al. | 375/27 |
| 5,023,910 | 6/1991 | Thomson | 381/37 |
| 5,124,791 | 6/1992 | Israelsen et al. | 358/136 |
| 5,247,357 | 9/1993 | Israelsen | 358/133 |
| 5,377,301 | 12/1994 | Rosenberg | 395/2.31 |
| 5,396,576 | 3/1995 | Miki | 395/2.31 |
| 5,432,883 | 7/1995 | Yoshihara | 381/36 |

OTHER PUBLICATIONS

"Vector Quantization and Signal Compression", by Allen Gersho & Robert M. Gray, Kluwer Academic Publishers, pp. 410–423.

*Primary Examiner*—Eric Coleman
*Attorney, Agent, or Firm*—Blakely, Sokoloff, Taylor & Zafman

[57] ABSTRACT

Methods and apparatus for vector quantization. A threshold generator generates an i threshold (Threshold$_i$) to be associated with each i quantized vector of n quantized vectors in a vector quantization codebook. The vector quantization codebook and the thresholds are used by a vector quantizer to encode a set of input vectors ($V_1$–$V_{TOT}$). The determination that a distance between a vector to be encoded and a quantized vector in a codebook is less than the associated threshold causes a search for the closest vector to terminate for a nearest neighbor vector quantizer. In some embodiments, the vectors comprise samples of continuous signals for sound containing speech, or display signals. In other embodiments, codebook vectors are arranged from most frequently encoded vectors to least frequently encoded vectors.

10 Claims, 5 Drawing Sheets

VECTOR QUANTIZATION USING THRESHOLDS

This continuation of application Ser. No. 08/082,022, filed Jun. 23, 1993 now U.S. Pat. No. 5,481,739.

BACKGROUND OF THE INVENTION

1. Field of the Invention

The present invention relates to the field of vector quantization. Specifically, the present invention relates to a technique which increases the performance of vector quantization for applications such as speech recognition and computer graphics.

2. Background Information

Many modern applications, such as speech recognition and video compression, require algorithms that process large sets of vectors. In some instances, these vectors may be sampled from audio signals containing speech for speech recognition applications or red-green-blue (RGB) color intensity values for computer graphics applications. It is not always possible in certain applications to represent full fidelity of this input signal or vector. A 24-bit color image may not be able to be displayed on an 8-bit display, for example. In this example, a color map is used wherein vectors for each of the RGB color values are quantized to map to colors which may be displayed upon the 8-bit display. Therefore, in this case, a table of 256 "quantized-"vectors (VQ's) is chosen to represent the color vector space. Each color vector is matched with its closest neighbor in the VQ table and stored using a table index. This type of vector quantization is known as a nearest-neighbor technique.

Vector quantization requires efficient searching techniques. One of the most prevalent types of algorithms used in prior art vector quantization techniques is known as the nearest neighbor or Voronoi class of vector quantizers. These quantizers simply compute the distance from each input vector being quantized and a quantized vector or VQ in a "codebook" or table containing VQ's. The vector being quantized is then encoded as the VQ which is closest. This technique tends to be more or less accurate (although it does incur some loss in fidelity of the input vector), however, it requires that an entire codebook be searched prior to deciding which VQ is closest to the input vector. Therefore, these techniques are not very efficient and significant processing time is consumed because the entire codebook must be searched every time a vector is quantized.

More efficient algorithms divide the VQ codebook into many smaller codebooks. Given an input vector, these algorithms select progressively smaller tables in a "tree" which have the closest VQ to the vector being encoded. These types of quantizers are known as "tree-searched vector quantizers" or TSVQ's. The search narrows at each branch of the tree to smaller and smaller tables until a terminal node or "leaf" in the tree is reached. Upon reaching a leaf in the tree which may have several VQ's associated with it, the nearest neighbor to the vector being quantized is then determined for encoding. The effective search time using such a TSVQ can be reduced at most by a factor of the number N of children at each branch in the tree for each level in the tree over standard Voronoi search methods. If the tree has m levels, the greatest improvement is $N^m$.

Notwithstanding faster search algorithms employed through the use of TSVQ's, vector quantization still requires that a set of quantized vectors be searched to determine which of the quantized vectors is closest to the input vector for coding.

Even TSVQ's require that each VQ in the terminal nodes be scanned in order to determine the closest VQ to the input vector. Thus, if each leaf or terminal node contains ten quantized vectors, a search of all ten VQ's is required to be performed to determine which is closest to the input vector. Depending upon operating circumstances, searches of all VQ's may take lengthy periods of time and degrade the performance of a vector quantizer encoding an input signal. Thus, more efficient vector quantizers which use more efficient search techniques are desired.

SUMMARY AND OBJECTS OF THE INVENTION

One of the objects of the present invention is to accelerate the efficiency of vector quantization methods and apparatus.

Another of the objects of the present invention is to provide an improved means for determining a nearest neighbor of a vector to be quantized without searching all quantized vectors in a codebook.

These and other objects of the present invention are provided for by methods and apparatus for vector quantization comprising a codebook generator for creating a codebook representative of a set of training vectors, the codebook comprising a representative set of n quantized vectors from the training vectors. In different embodiments, the codebook may be either a standard vector quantization codebook, or a leaf or terminal node of a tree-searched vector quantization (TSVQ) codebook. A threshold generator generates an i threshold ($Threshold_i$) to be associated with each i quantized vector of the n quantized vectors. In some described embodiments, the i threshold comprises half a distance between the i quantized vector and a k quantized vector ($VQ_k$) of the n quantized vectors, wherein i<k<n, and the k quantized vector is the closest quantized vector to the i quantized vectors of a set of quantized vectors having an index k wherein i<k<n. For each i quantized vector of the n quantized vectors, the i threshold is associated with the i quantized vector in the vector quantization codebook and the vector quantization codebook and the thresholds are used by a vector quantizer to encode a set of input vectors ($V_1$–$V_{TOT}$). In various embodiments, the determination that a distance between a vector to be encoded and a quantized vector in a codebook is less than the associated threshold causes a search for the closest vector to terminate for a nearest neighbor vector quantizer. In other embodiments, the vectors comprise samples of continuous signals for sound containing speech, or display signals. In yet other embodiments, codebook vectors are arranged from most frequently encoded vectors to least frequently encoded vectors. In yet other embodiments, vectors may be arranged by distances proximate to each other in coordinate space (e.g., Cartesian coordinate space).

Other features, objects, and advantages of the present will become apparent from viewing the figures and the description below.

BRIEF DESCRIPTION OF THE DRAWINGS

The present invention is illustrated by way of example and not limitation in the figures of the accompanying in which like references indicate like elements and in which.

DETAILED DESCRIPTION

The methods and apparatus of the present invention comprises thresholding which is used in conjunction with a vector quantizer to speed vector quantization of vectors sampled from signals. Vectors may be sampled from many types of signal data, including, but not limited to, speech, graphic data, or other information. For the remainder of this application, specific data, method steps, variables, and apparatus will be discussed, however, these are merely for illustrative purposes and are not intended to limit the present invention. It can be appreciated by one skilled in the art that many departures can be made from these specific embodiments by one skilled in the art without departing from the general spirit and scope of the present invention.

Figure 1:
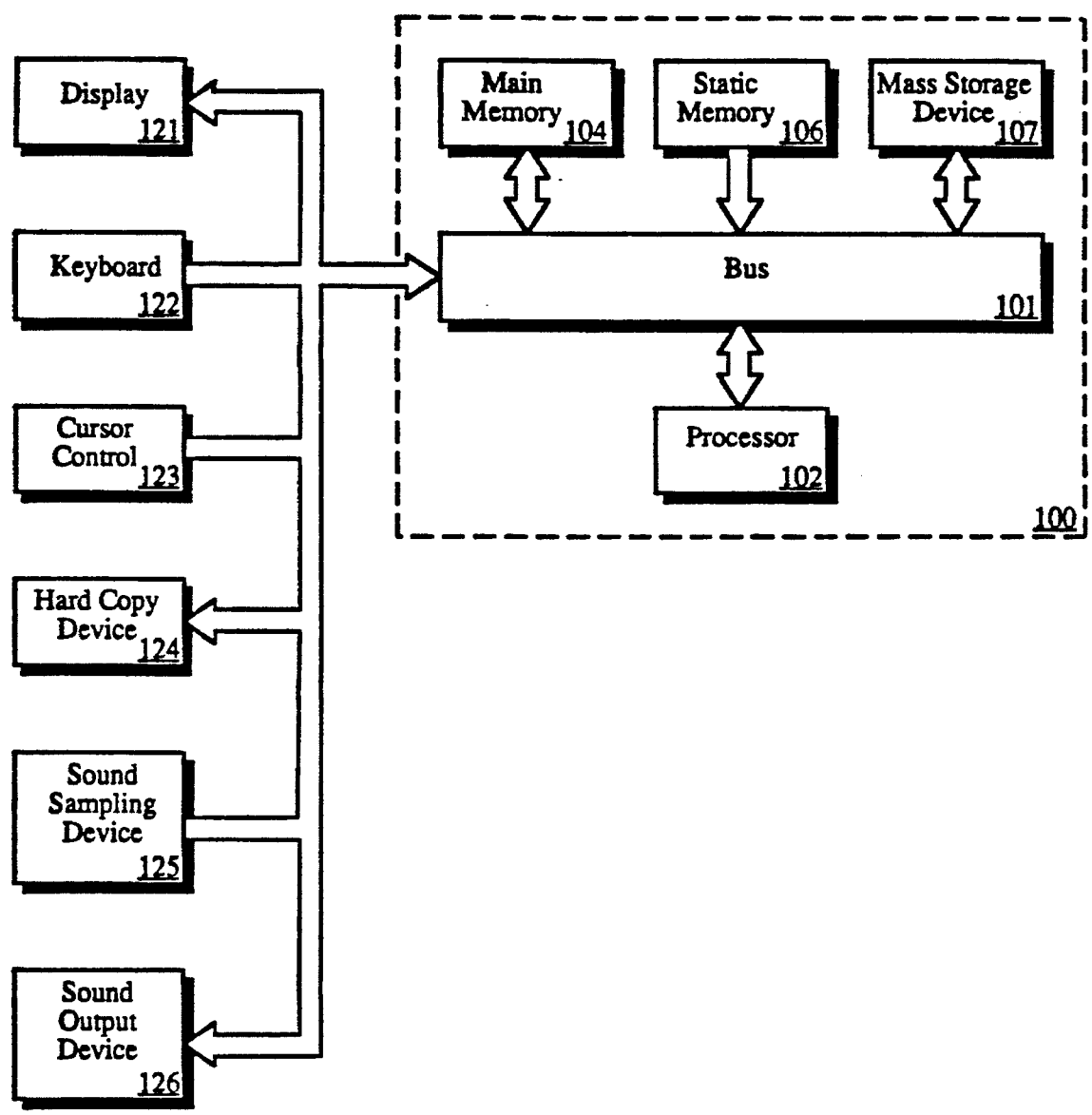
FIG. 1 shows a system upon which one embodiment of the present invention may be implemented.

Referring to FIG. 1, a system upon which one embodiment of the present invention is implemented is shown as 100. 100 comprises a bus or other communication means 101 for communicating information, and a processing means 102 coupled with bus 101 for processing information. System 100 further comprises a random access memory (RAM) or other volatile storage device 104 (referred to as main memory), coupled to bus 101 for storing information and instructions to be executed by processor 102. Main memory 104 also may be used for storing temporary variables or other intermediate information during execution of instructions by processor 102. Computer system 100 also comprises a read only memory (ROM) and/or other static storage device 106 coupled to bus 101 for storing static information and instructions for processor 102, and a data storage device 107 such as a magnetic disk or optical disk and its corresponding disk drive. Data storage device 107 is coupled to bus 101 for storing information and instructions. Computer system 100 may further be coupled to a display device 121, such as a cathode ray tube (CRT) or liquid crystal display (LCD) coupled to bus 101 for displaying information to a computer user. In one embodiment, the information transmitted to display 121 is in red-green-blue (RGB) format wherein magnitudes of red, green, and blue color values are represented internally in system 100. In another embodiment, brightness or other values (e.g., luminance) may be represented and transmitted to display 121. An alphanumeric input device 122, including alphanumeric and other keys, may also be coupled to bus 101 for communicating information and command selections to processor 102. An additional user input device is cursor control 123, such as a mouse, a trackball, stylus, or cursor direction keys, coupled to bus 101 for communicating direction information and command selections to processor 102, and for controlling cursor movement on display 121. Another device which may be coupled to bus 101 is hard copy device 124 which may be used for printing instructions, data, or other information on a medium such as paper, film, or similar types of media. Note, also, that any or all of the components of system 100 and associated hardware may be used in various embodiments, however, it can be appreciated that any configuration of the system may be used for various purposes as the user or application requires. For example, in another embodiment, sound sampling device 125 may be coupled to system bus 101 for sampling and digitizing continuous sound sources (e.g., speech) for processing. System 100 may further have coupled to it sound output device 126 for presenting audio output to a user such as synthesized speech.

In one embodiment, system 100 is one of the Macintosh® family of personal computers such as the Macintosh® Quadra™ or Macintosh® Performa™ brand personal computers manufactured by Apple® Computer, Inc. of Cupertino, Calif. (Apple, Macintosh, Quadra, and Performa are trademarks of Apple Computer, Inc.). Processor 102 may be one of the 68000 family of microprocessors, such as the 68030 or 68040 manufactured by Motorola, Inc. of Schaumburg, Ill.

Note that the following discussion of various embodiments discussed herein will refer specifically to a series of routines which are generated in a high-level programming language (e.g., the C++ language available from Symantec of Cupertino, Calif.) and compiled, linked, and then run as object code in system 100 during run-time. It can be appreciated by one skilled in the art, however, that the following methods and apparatus may be implemented in special purpose hardware devices, such as discrete logic devices, large scale integrated circuits (LSI's), application-specific integrated circuits (ASIC's), or other specialized hardware. The description here has equal application to apparatus having similar function.

A typical process for vector quantization performed by either a programmed general purpose computer or a specific hardware apparatus is illustrated with reference to FIG. 2. For example, in one embodiment, a series of input training vectors 201 sampled from a signal or series of signals may be input to a process (or apparatus) 202 for codebook generation in a system. Then, using either a prior art TSVQ or other codebook generation techniques, the codebook generator 202 may generate a series of quantized vectors (VQ's) in a codebook 203 which allows the quantization of input vectors from sampled input signals to be encoded. Each of the codebook entries in 203 may be referenced using a typical TSVQ method or purely by index in a standard codebook. (For the remainder of this application, a codebook search will refer to that either done at the terminal nodes of a TSVQ codebook or search in a standard codebook.) Codebook 203 may then be input to threshold generator 204 which calculates associated thresholds for each of the VQ entries in codebook 203. These thresholds, which will be discussed later, improve the quantization process so that not all vectors in the codebook 203 have to be searched to find the nearest VQ neighbor to encode the vectors. Threshold generation will be discussed in more detail below. Then, threshold generator 204 creates an improved codebook 205 which includes the VQ codebook entries and their associated thresholds. Improved codebook 205 may be used by a vector quantizer 207 to encode input vectors $V_i$ from an input signal.

For example, a sequence of vectors 206, such as those from video graphic dam or sampled from continuous audio data (e.g., that containing speech) may be input to a vector quantizer 207 for encoding. Vector quantizer 207 will generate a series of encoded vectors 208, such as codebook indices or other data 208, which may be used by a decoder 209 for reconstructing the vector(s) as decoded vectors 210 (e.g., so that vectors 210 may be displayed or otherwise manipulated in system 100). Vector quantizer 207 may be any of typical prior art vector quantizers, with the exception that threshold and codebook entries 205 are used together instead of a simple VQ codebook 203 containing only quantized vectors, as illustrated in FIG. 2. Vector quantizer 207 may include any of the typical prior an vector quantization techniques, such as nearest neighbor (Voronoi) or TSVQ techniques, such as those common in prior art systems with some modifications. The vector quantizer 207 may also be used in combination with a codebook generator 202 so that training vectors 201 may be, in fact, the same as the sampled vectors to be quantized (e.g., 206 shown in FIG. 2). It can be appreciated that other vector quantizers may be used within the spirit and scope of the present invention.

One embodiment of the present invention utilizes a tree vector quantizer 207, however, a flat or standard vector quantizer may be used in other embodiments. In the embodiments of the present invention, VQ's in codebook 203 are compared against nearest VQ's. Then, thresholds are associated with each of the VQ's so that any subsequently indexed VQ's in the codebook (or subcodebook in a leaf of a codebook in a TSVQ) are guaranteed to not be any closer than the current vector being examined if the vector being encoded is less than a threshold distance from the VQ being checked. For example, with reference to FIG. 3, a series of quantized vectors $VQ_1$–$VQ_9$ in a codebook (such as 203 of FIG. 2) may be illustrated as residing in two-dimensional space as shown in FIG. 3. For a given vector x being quantized, there is a relationship between the distances $D_1$, $D_2$, and $D_3$ from x and the two nearest quantized vectors $VQ_4$ and $VQ_8$. For example, $VQ_8$ may be closest vector to $VQ_4$ in the codebook containing vectors $VQ_i$–$VQ_9$. If the vectors $VQ_1$–$VQ_9$ are associated in the order specified by the index in the codebook, then a threshold may be associated with each vector $VQ_i$ (e.g., $VQ_4$) to ensure that no subsequent vector ($VQ_5$–$VQ_9$) will be any closer to the vector x to be encoded. The present invention takes advantage of this relationship.

During typical prior art vector quantization, the vector x will be encoded as the quantized vector $VQ_4$. In the prior art, the remaining vectors $VQ_5$–$VQ_9$ still have to be examined to determine whether any of the remaining VQ's are closer to x than $VQ_4$. The present invention associates a threshold (e.g., $Thresh_4$) with each VQ vector (e.g., $VQ_4$) so that, if the distance (e.g., $D_1$) between the vector being examined (e.g., x) is less than the threshold, then the vector is guaranteed to not be closer to any succeeding $V_Q$ in the codebook.

For a vector to be quantized x, the triangle inequality states that for any three vectors x, y, and z:

$$\|x-y\| <= \|x-z\| + \|z-y\|$$

wherein $\|x-y\|$ is the distance from vector x to vector y in Cartesian coordinate space. In one embodiment wherein the vectors x, y, and z may be represented with two dimensions in Cartesian coordinate space, the distance $\|x-y\|$ is defined as:

$$\|x-y\| = sqrt[sum\ (x_i-y_i)^2]$$

Although this metric measure is used in one embodiment of the present invention, any metric measure may be used. The Cartesian metric is used in this embodiment, however, this relationship applies to any metric. Any "metric" satisfies the triangle inequality. Returning to FIG. 3 and using the triangle inequality therefore gives:

$$D_1 \leq D_2 + D_3$$

The threshold $Thresh_4$, for a vector such as $VQ_4$, will be determined as follows:

$$Thresh_4 = 0.5 \cdot D_3$$

wherein D3 is the distance from the VQ whose threshold is being calculated ($VQ_4$) to the VQ (e.g., $VQ_8$) having the minimum distance for the remaining vectors in the set (e.g., $VQ_5$–$VQ_9$). Thus, for any quantized vector $VQ_i$, the threshold may be calculated as follows:

$$Thresh_i = 0.5 \cdot min_{k>i} \|VQ_i - VQ_k\|$$

If the distance:

$$\|x - VQ_i\| < Thresh_i$$

then $$\|x - VQ_k\| \geq \|x - VQ_i\|$$

for all k>i.

In one embodiment of the present invention, in order to further improve the efficiency of vector quantization, vectors in the codebook (or terminal nodes in a TSVQ) which is being searched using the thresholds computed in this manner are ordered from most frequently encoded vector $VQ_1$ to least frequent encoded vector $VQ_N$ in the training set. In another embodiment of the present invention, codebook entries may be ordered according to their relative distances to one another to further increase the efficiency of the search. Threshold generation after the generation of a codebook from a series of training vectors and the association with quantized vectors in the codebook will now be discussed with reference to 400 of FIG. 4.

Threshold Generation

Figure 2:
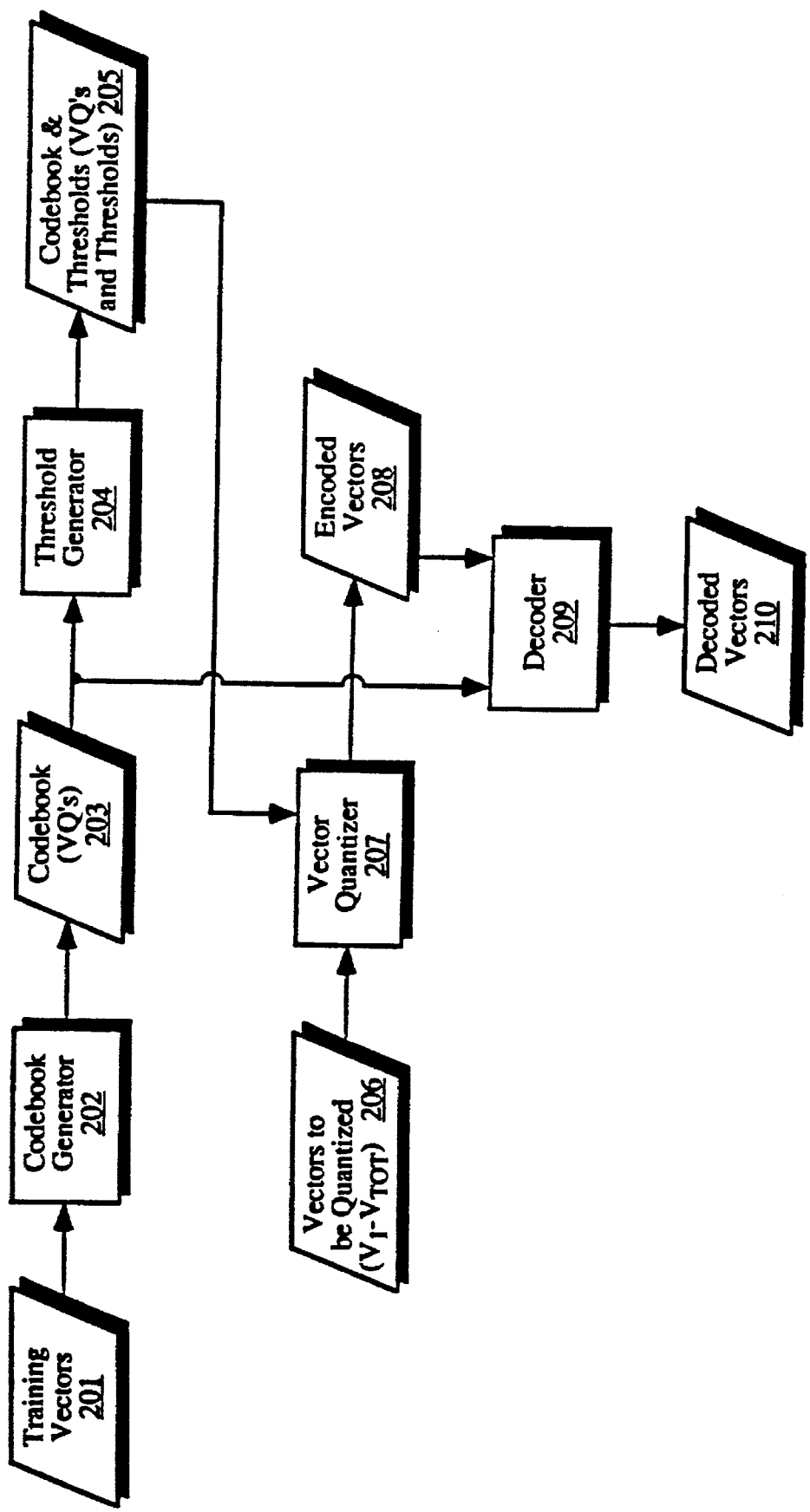
FIG. 2 shows a block diagram of each of the stages of processing which are taken to perform vector quantization on a sequence of vectors, such as those representing audio or video data.
Figure 3:
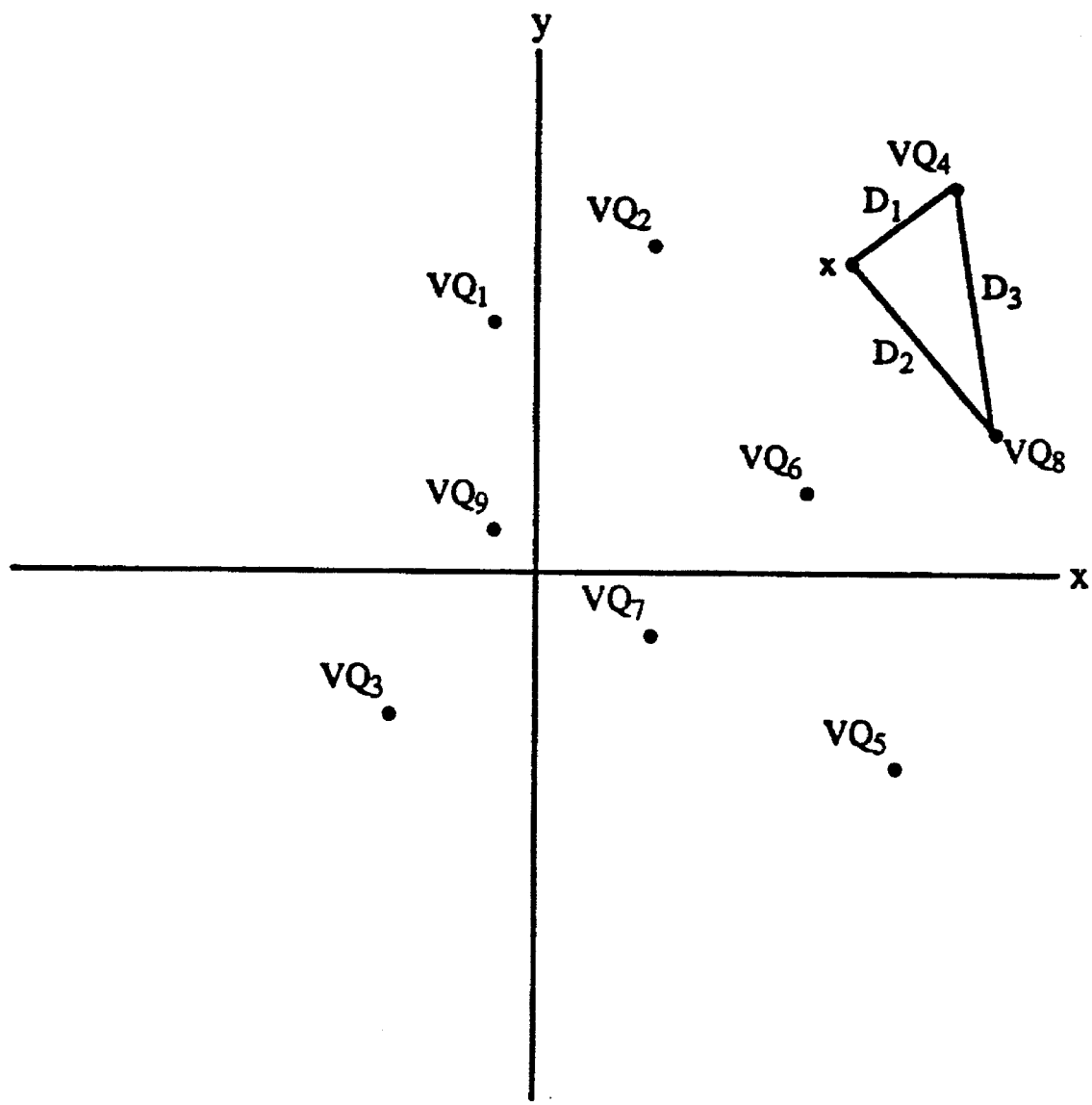
FIG. 3 shows two-dimensional space in which various quantized vectors (VQ's), and an input vector to be quantized is represented.
Figure 4:
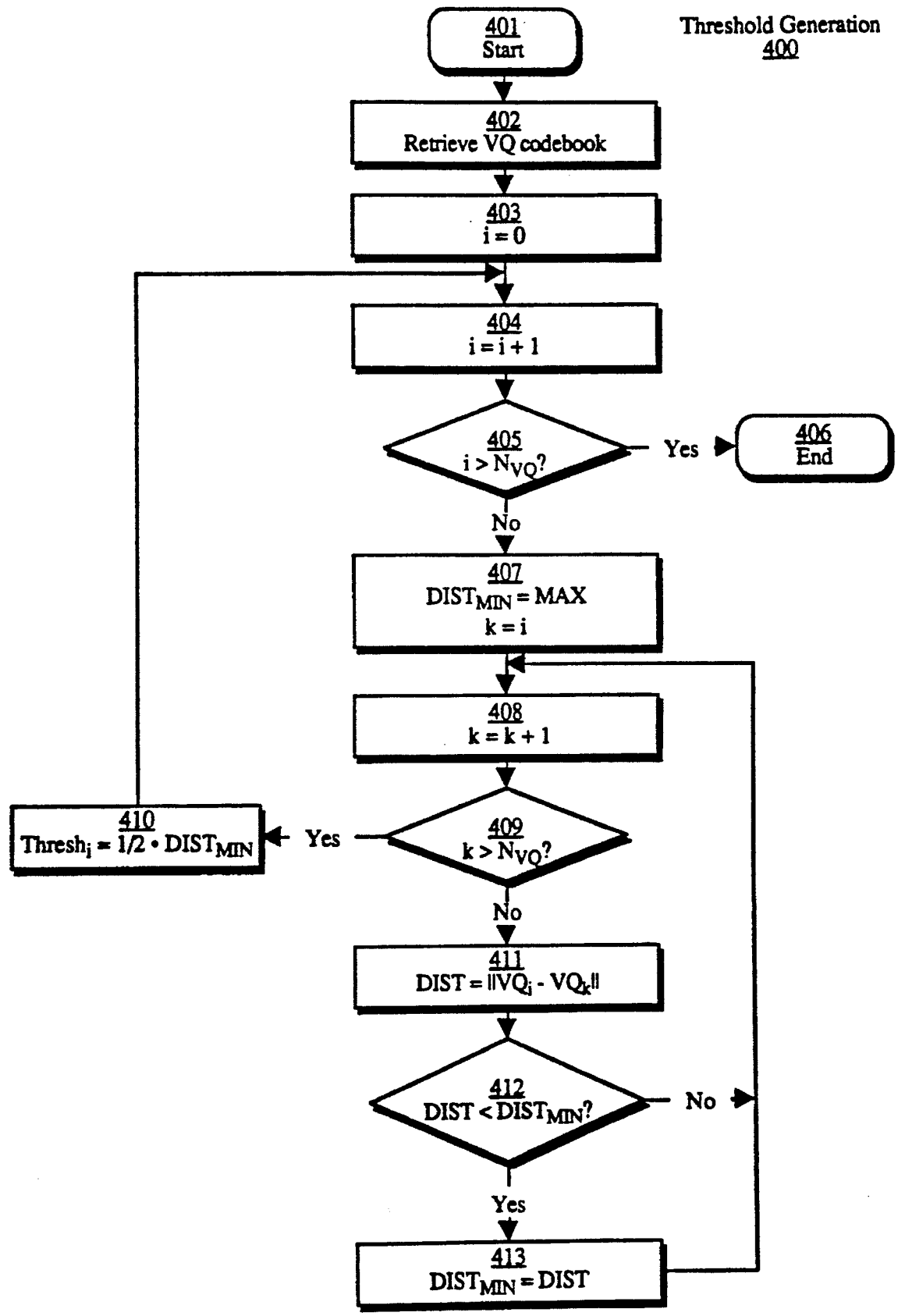
FIG. 4 shows a process flow diagram of a process for threshold generation which is used in one embodiment of the present invention.

FIG. 4 illustrates a flow diagram of a process 400 which may be embodied in an apparatus having this function or a method in a general purpose computer which is used for threshold generation (e.g., 204 of FIG. 2). This process will use an input codebook which is a series of VQ's 203 which have been previously generated by a codebook generator (e.g., 202 of FIG. 2) from a series of training vectors 201 sampled from input signal(s). As discussed previously, codebook 203 may be ganged so that the entries are listed from most frequently occurring VQ's to least frequent VQ's to make the process of searching the codebook most efficient, however, this is not necessary for practicing the present invention. In this embodiment, the codebook received by the threshold generation process 400 (e.g., 203 of FIG. 2) may be a subcodebook residing at a terminal node in a TSVQ codebook upon traversing the tree during encoding, or it may be a standard codebook with no associated tree structure. At any rate, this method will be performed on each VQ in terminal nodes in a TSVQ codebook or each VQ in a standard codebook.

A threshold generation process will start at a process entry point such as 401 and retrieve the VQ codebook (e.g., 203 of FIG. 2) at step 402. Then, in a typical manner, an index variable such as i may be assigned to an initial value (e.g., 0), as is illustrated in step 403 of FIG. 4. Then, using a typical preincrement process step at step 404, the index variable may be incremented, and it may be determined at step 405 whether the index variable i has exceeded the number of vectors $N_{VQ}$ in VQ codebook 203. If so, then threshold generation process 400 terminates at step 406, as is illustrated in FIG. 4, the process exit point. If, however, the number of entries in VQ codebook 203 has not been exhausted, that is, thresholds have not been calculated for all VQ's in codebook 203, then, at step 407, certain variables for use within the process may be initialized. In this instance, a distance variable $DIST_{MIN}$ may be set to some maximum value (e.g., MAX=13 such as the maximum number range which may be represented in the system) at step 407, and a second index variable k may be set equal to i. This will allow subsequent VQ's in the codebook to be scanned to see which is closest to the VQ for which the threshold is being calculated. Then, in a typical manner, at step 408, the index variable k may be incremented. Again, in a typical manner, at step 409, it may be determined whether all entries in the codebook have been exhausted at step 409. That is, the index variable k has exceeded the number of entries in the codebook $N_{VQ}$. If not, however, then process 400 proceeds to step 411. At step 411, a current distance value (e.g., DIST) may be generated from the current vector $VQ_i$ and the subsequent vector $VQ_k$ being examined using a Cartesian norm. It can be appreciated by one skilled in the art, however, that any metric distance calculation may be used at step 411. At any rate, the distance value DIST is then checked against the minimum distance value $DIST_{MIN}$ determined so far at step 412, and if the value is, in fact, less than the minimum distance value, then process 400 proceeds to step 413. Step 413 sets the minimum distance value $DIST_{MIN}$ equal to the current distance value DIST. In either case, whether the distance value DIST<$DIST_{MIN}$ or not, then either of steps 412 or 413 return to step 408 for incrementing index k and determination of whether the remaining vectors in the codebook have been examined.

Once all of the subsequent vectors in the codebook have been examined for the calculation of $Thresh_i$, as detected at step 409 of process 400, then, at step 410, the threshold value $Thresh_i$ is generated from ½ the minimum distance value $DIST_{MIN}$ at step 410. This may be done with a multiplier or a shift operation in hardware apparatus. Then, this value $Thresh_i$ is associated with the codebook or subcodebook entry $VQ_i$, and process 400 may proceed back to step 404 for the retrieval of an additional vector $V_{i+1}$ front codebook 203. This process continues in this manner until, as detected at step 405, all VQ's in codebook 203 have been examined which occurs upon the index i exceeding $N_{VQ}$, as detected at step 405. Then, threshold values for all the vectors $VQ_1$–$VQ_N$ have been calculated, and process 400 terminates at step 406, a typical process exit point.

In the preceding manner, thresholds are thus associated with each of the entries in codebook 203 (or subcodebook associated with a terminal node in a TSVQ) and a improved codebook 205 is generated. Thresholds may then be used in conjunction with a nearest neighbor search to increase the efficiency and performance of vector quantization. As previously mentioned, the codebook is preferably ordered from most probable $VQ_1$ to the least probable encoded vector $VQ_N$ (as determined from occurrences in the training set 201), however, this is not necessary for practicing the present invention.

Improved Vector Quantization

Figure 5:
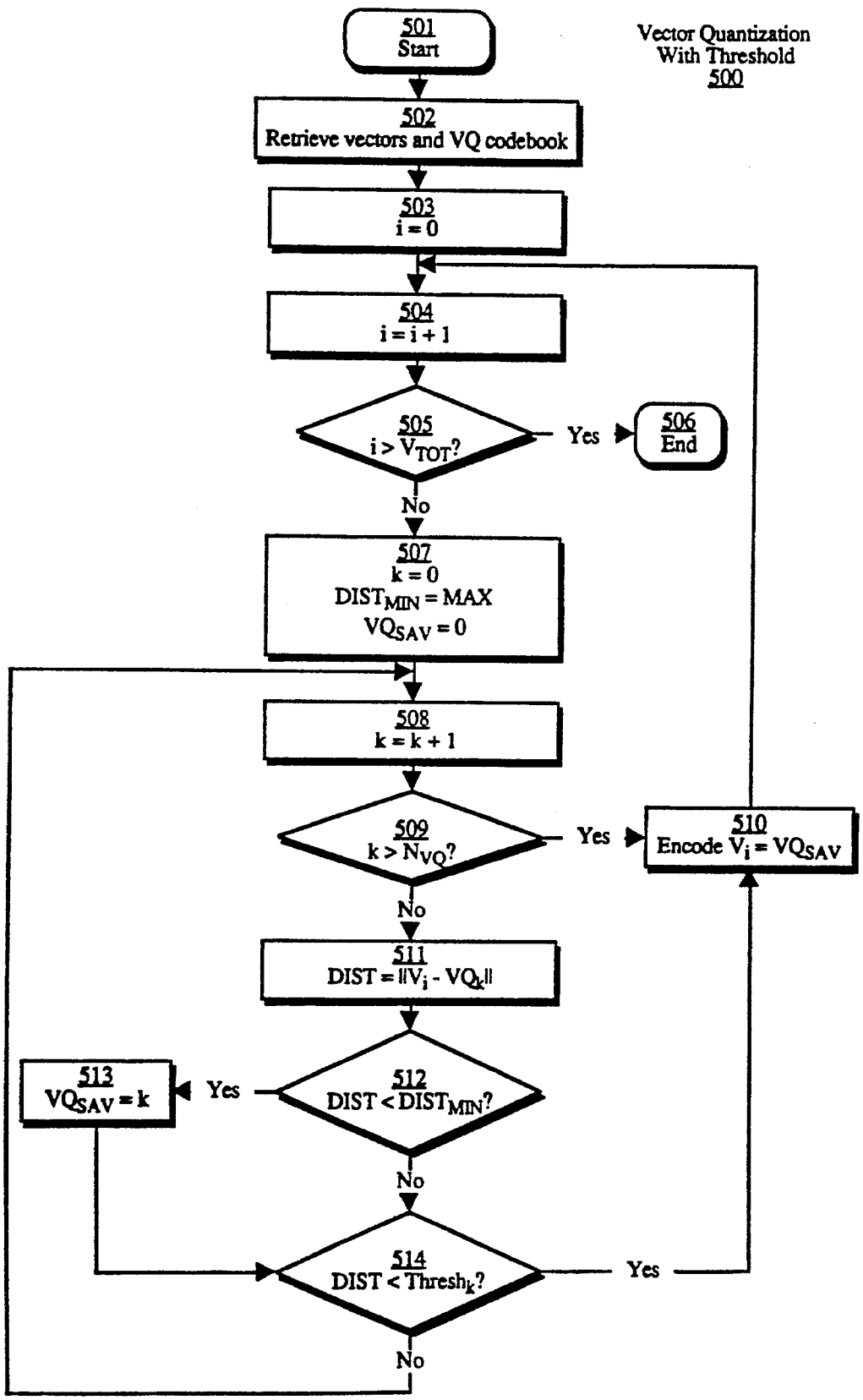
FIG. 5 shows a process flow diagram of a vector quantization method which uses a nearest neighbor search algorithm in conjunction with one embodiment of the present invention.

An improved nearest neighbor or Voronoi vector quantizer, such as that implemented by a vector quantizer (e.g., 207 of FIG. 2), is illustrated in the process flow diagram 500 of FIG. 5. Using the improved codebook 205 with associated thresholds generated from a codebook generator 202 and threshold generator 204, vector quantizer 207 may have substantially improved performance over prior art vector quantizers which use standard prior art nearest neighbor search techniques. In any case, the process will now be described with reference to process 500 of FIG. 5 which may be a method in a general purpose computer or apparatus implementing functions similar to the process steps shown in FIG. 5.

Process 500 will receive as an input the codebook and threshold values 205 previously calculated from a series of vectors sampled from an input signal (e.g., sampled speech signals or vectors in RGB color space) which will be quantized using VQ's contained in a codebook (e.g., 203 of FIG. 2). Then, encoded vectors 208 (typically represented using indices) may then be used in conjunction with codebook 203 by a decoder such as 209 shown in FIG. 2 in order to generate a series of decoded vectors 210 (e.g., color values to be displayed upon a display 121 or speech components for additional processing in a speech recognition system). Process 500 commences at a step such as 501 which may be a process entry point. Process 500 then proceeds to step 502 which retrieves the vectors $V_1$–$V_{TOT}$ to be encoded (e.g., 206 of FIG. 2) and codebook and threshold values to be used for encoding (e.g., 205 of FIG. 2). Then, in a typical manner, an index variable i may be set to some initial value (e.g., 0) at step 503. The index may be then preincremented at a step such as 504, and it may be determined whether the index i has exceeded the number $V_{TOT}$ of vectors to be quantized. Once the index i has exceeded the maximum number $V_{TOT}$ Of vectors, such as determined at step 505, then the process ends at step 506, a typical process exit point. If the total number of input vectors $V_{TOT}$ has not been exhausted, as determined at step 505, then process 500 may proceed to step 507 wherein certain variables used within the process may be initialized. This may include, but not be limited to, setting a second index variable k equal to some initial value (e.g., 0), a minimum distance value $DIST_{MIN}$ equal to some maximum value (e.g., a maximum value which may be represented in the system), and closest VQ index saved value $VQ_{SAV}$ equal to zero. Then, process 500 will proceed to determine which of the vectors in the codebook is used for quantizing the input vector $V_i$.

In a typical manner, the index variable k may be preincremented at step 508, and it may be determined whether the index variable has exceeded the number of vectors in the codebook $N_{VQ}$ at step 509. If so, then the input vector $V_i$ is encoded using the saved index variable $VQ_{SAV}$ at step 510, and process 500 returns to step 504 for retrieval of the subsequent vector $V_{i+1}$ from input vectors 206. In this instance, the index for the closest VQ has been previously saved, for instance, at step 513, in a previous iteration of the loop. If, however, the vectors in the codebook have not been exhausted, as detected at step 509, then the current distance DIST from the vector $V_i$ and the current quantized vector $VQ_k$ is determined at step 511. This may be done with any number of distance measures, however, in this embodiment, it is performed using a Cartesian norm $\|V_i - VQ_k\|$.

It is determined whether the current calculated distance DIST is less than the minimum distance $DIST_{MIN}$ so far determined at step 512, such as used in prior art nearest neighbor techniques. If so, then the index for the quantized vector k is saved in a typical storage location such as $VQ_{SAV}$ at step 513, and process 500 continues at step 514. If the distance value DIST is not less than the current minimum distance $DIST_{MIN}$ value determined thus far at step 512, then the minimum distance value' $DIST_{MIN}$ is left unchanged, and process 500 continues to step 514. Then, at step 514 of process 500, it may be determined whether the distance value DIST has become less than the threshold value $Thresh_k$ associated with the quantized vector $VQ_k$. If so, then the subprocess terminates, and the vector $V_i$ is encoded using the index previously saved $VQ_{SAV}$ at step 510. That is, it has been determined that the distance from the vector to be encoded $V_i$ and the quantized vector $VQ_k$ being examined has become less than the threshold $Thresh_k$ associated with the quantized vector $VQ_k$. This guarantees that no subsequent VQ in the codebook $VQ_{k+1}$ to $VQ_{N_{VQ}}$ (or codebook for a terminal node in a TSVQ codebook) is closer to $V_1$ than $VQ_k$. Step 510 then proceeds back to step 504 for retrieval and encoding of the next vector $V_{i+1}$ in vector input bitstream 206. Process 500 thus is a substantial improvement over prior art techniques which rely simply upon a distance check between the vector being encoded $V_i$ and all vectors in the codebook $VQ_1$-$VQ_{N_{VQ}}$. A typical nearest neighbor search for the vector being quantized will terminate at step 509 wherein all vectors in the codebook $VQ_{1-VQN}$ have been examined. The present invention therefore has substantial advantages over prior art techniques which have no thresholds associated with codebook entries because, in many circumstances, it avoids searching the entire codebook since step 514 will terminate this process. In most instances, only a portion of the codebook needs be searched. Used in conjunction with a TSVQ vector quantizer and codebook which has entries ordered from most probable occurrence to least probable occurrence, this embodiment poses substantial performance improvements over the prior art.

In any event, all of steps 508–514 proceed in a normal manner until the subprocess is terminated by either the determination that all vectors in the codebook $N_{VQ}$ have been examined, as detected at step 509, or the distance between the vector $V_i$ being encoded and the current quantized vector $VQ_k$ being examined has become less than the threshold $Thresh_k$ associated with the vector, as detected at step 514. In either event, the vector $V_i$ is encoded using the index $VQ_{SAV}$, and process 500 proceeds to step 504 to retrieve the next vector $V_{i+1}$ from the input bitstream 206 shown in FIG. 2.

A vector quantizer such as 207 in FIG. 2 may operate substantially faster than the prior art by the use of an improved codebook 205 which has an associated threshold for each VQ in the codebook. Although FIGS. 4 and 5 have illustrated embodiments of the present invention as improved methods, it can be appreciated by one skilled in the art that these methods may be implemented in discrete hardware devices and/or dedicated apparatus in a vector quantizer 207 and threshold generator 204, and minor departures from the function of such apparatus as is embodied in methods 400 and 500 should not be viewed as limiting upon the present invention.

Thus an invention for improved vector quantization has been described using thresholds associated with quantized vectors in codebooks. Although the foregoing methods and apparatus have been described with reference to specific embodiments thereof, it can be appreciated by one skilled in the art that many departures and/or modifications may be made without departing from the overall spirit and scope of the present invention. Thus, it can be appreciated that these methods and apparatus may have equal application to other apparatus and methods which fall within the scope of the appended claims.

What is claimed is:

1. In a computer system, a method of vector quantization, comprising the following steps:

a) creating a vector quantization codebook comprising n quantized vectors;

b) for each i quantized vector ($VQ_i$) of said n quantized vectors, determining an i threshold ($Threshold_i$) to be associated with said i quantized vector;

c) for each i quantized vector of said n quantized vectors, associating said i threshold with said i quantized vector in said vector quantization codebook; and d) using said vector quantization codebook to encode a set of input vectors ($V_1$-$V_{TOT}$), wherein for each input vector being coded, sequencing using an index j through said vector quantization codebook and determining for each j quantized vector in said vector quantization codebook if the distance between said input vector being coded and said j quantized vector is less than said j threshold associated with said j quantized vector then encoding said input vector and terminating sequencing through said vector quantization codebook.

2. The method of claim 1, wherein during said step of using said vector quantization codebook to encode a set of input vectors if it is determined that the distance between said input vector being coded and said j quantized vector is less than said j threshold associated with said j quantized vector, said input vector is encoded as said j index.

3. The method of claim 1 wherein said input vectors are video graphic data.

4. A data compression system comprising:

an encoder, said encoder receiving an input data stream comprising a set of input vectors to be compressed, said encoder comprising a vector quantization codebook of n quantized vectors and n thresholds, wherein for each i quantized vector of said n quantized vectors there is an $i^{th}$ threshold of said n thresholds associated with said i quantized vector, wherein said encoder encodes said input vectors by sequencing through said vector quantization codebook using an index j and determining for each j quantized vector in said vector quantization codebook if the distance between said input vector being coded and said j quantized vector is less than said j threshold then encoding said input vector as an encoded vector and terminating sequencing through said vector quantization codebook, and wherein said encoder outputs said encoded vector.

5. A data compression system as in claim 4 further comprising storage means, said storage means coupled to said encoder and receiving said encoded vectors, said encoded vectors being stored in said storage means.

6. A data compression system as in claim 4 further comprising a decoder coupled to said encoder, said decoder receiving said encoded vectors and reconstructing said encoded vectors as decoded vectors.

7. A data compression system as in claim 6 further comprising display means coupled to said decoder, wherein said input vectors are video graphic data, and wherein said decoded vectors are displayed on said display means.

8. An apparatus for decoding encoded input vectors comprising:

a decoder for reconstructing said encoded input vectors as decoded vectors wherein said encoded input vectors are encoded using a method of vector quantization, said method comprising the steps of:

a) creating a vector quantization codebook comprising n quantized vectors;

b) for each i quantized vector ($VQ_i$) of said n quantized vectors, determining an i threshold ($Threshold_i$) to be associated with said i quantized vector;

c) for each i quantized vector of said n quantized vectors, associating said i threshold with said i quantized vector in said vector quantization codebook; and d) using said vector quantization codebook to encode a set of input vectors ($V_1$–$V_{TOT}$), wherein for each input vector being coded, sequencing using an index j through said vector quantization codebook and determining for each j quantized vector in said vector quantization codebook if the distance between said input vector being coded and said j quantized vector is less than said j threshold associated with said j quantized vector then encoding said input vector and terminating sequencing through said vector quantization codebook.

9. The apparatus of claim 8, wherein during said step of using said vector quantization codebook to encode a set of input vectors if it is determined that the distance between said input vector being coded and said j quantized vector is less than said j threshold associated with said j quantized vector, said input vector is encoded as said j index.

10. The apparatus of claim 9 further comprising a display device coupled to said decoder, and wherein said decoded vectors are video graphic data.

* * * * *